(12) United States Patent
Hsia et al.

(10) Patent No.: US 11,777,515 B2
(45) Date of Patent: Oct. 3, 2023

(54) COLUMN ANALOG-TO-DIGITAL CONVERTER AND LOCAL COUNTING METHOD THEREOF

(71) Applicant: Novatek Microelectronics Corp., Hsinchu (TW)

(72) Inventors: Chih-Peng Hsia, Hsinchu County (TW); Cho-Hsuan Jhang, Hsinchu (TW); Su-Wei Lien, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 415 days.

(21) Appl. No.: 17/241,075

(22) Filed: Apr. 27, 2021

(65) Prior Publication Data
US 2022/0345147 A1  Oct. 27, 2022

(51) Int. Cl.
*H03M 1/34* (2006.01)
*H03M 1/50* (2006.01)
*H03K 5/135* (2006.01)
*H03K 5/156* (2006.01)
*H03M 1/82* (2006.01)

(52) U.S. Cl.
CPC ............ *H03M 1/508* (2013.01); *H03K 5/135* (2013.01); *H03K 5/1565* (2013.01); *H03M 1/825* (2013.01)

(58) Field of Classification Search
CPC ...... H03M 1/123; H03M 1/56; H03M 1/0617; H03M 1/0697; H03M 1/508; H03M 1/825; H04N 25/745; H04N 25/75; H04N 25/772

USPC ........ 341/155, 164, 169, 170; 348/241, 249, 348/302
See application file for complete search history.

(56) References Cited

U.S. PATENT DOCUMENTS

| | | | | |
|---|---|---|---|---|
| 8,031,241 B2 * | 10/2011 | Maeda | ............... | H04N 25/76 348/241 |
| 8,749,420 B2 * | 6/2014 | Takahashi | ............ | H03M 1/007 341/131 |
| 2005/0195304 A1 * | 9/2005 | Nitta | .................... | H04N 3/1562 348/E3.02 |
| 2010/0289931 A1 * | 11/2010 | Shibata | .................. | H04N 25/76 348/294 |
| 2011/0115663 A1 * | 5/2011 | Bogaerts | ............... | H03M 1/123 341/164 |
| 2012/0229319 A1 * | 9/2012 | Takahashi | ............. | H04N 25/75 341/155 |
| 2013/0016260 A1 * | 1/2013 | Maruta | ............... | H03M 1/0624 348/E3.016 |
| 2013/0068931 A1 * | 3/2013 | Iwaki | .................... | H04N 25/60 250/208.1 |

(Continued)

*Primary Examiner* — Linh V Nguyen
(74) *Attorney, Agent, or Firm* — JCIPRNET

(57) ABSTRACT

A column analog-to-digital converter and the local counting method is provided. The column analog-to-digital converter includes a plurality of analog-to-digital converters in parallel. Each of the analog-to-digital converters includes a comparator and a counting circuit. The comparator compares the ramp voltage with one of the plurality of column signals to generate a comparator output signal. The counting circuit generates a local clock by means of a voltage-controlled oscillator of the counting circuit according to the base clock and the comparator output signal, counts the base clock and the local clock respectively to generate a first counting output and a second counting output, and combines the first counting output with the second counting output to generate the counting output.

20 Claims, 15 Drawing Sheets

(56) References Cited

U.S. PATENT DOCUMENTS

2013/0207825 A1* 8/2013 Yamazaki ............. H03M 1/164
                                                    341/156
2018/0041218 A1* 2/2018 Sato .................... H03M 1/0845
2018/0139401 A1* 5/2018 Liabeuf ................. H04N 25/77
2020/0322555 A1* 10/2020 Ogawa ................. H04N 25/533

* cited by examiner

COLUMN ANALOG-TO-DIGITAL CONVERTER AND LOCAL COUNTING METHOD THEREOF

BACKGROUND OF THE INVENTION

1. Field of the Invention

The invention relates to an image sensor, and particularly relates to a column analog-to-digital converter (column ADC) and its local counting method.

2. Description of Related Art

A conventional CMOS image sensor (CMOS Image sensor, CIS) generally adopts a column analog-to-digital converter (CADC). CADC is usually composed of multiple successive-approximation register analog-to-digital converters (SAR ADC) or multiple single-slope analog-to-digital converters (single-slope ADC). Each single-slope ADC receives a column signal corresponding to a row of pixels, and the multiple single-slope ADCs share a digital-to-analog converter (DAC), a high-speed clock generator and a sense amplifier.

The single-slope ADC uses a counter to calculate an output length of the signal generated by comparing a ramp voltage and the column signal as the output of the ADC. Therefore, the resolution of the ADC depends on available counting time and a counting frequency. Nevertheless, the counting frequency is often limited by a loading of the clock tree, which increases the counting time at high resolution of ADC. In addition, the CADC counter is faced with a serious challenge of power consumption due to high counting frequency.

Since Correlated Double Sampling (CDS) and High Dynamic Range Imaging (HDR) are widely spread in the applications such as touch control, image sensing, and fingerprint recognition, it results in reduced available counting time. Moreover, the frame rate is limited by conversion time of ADC.

A conventional technology adopts phase delays to increase the resolution of ADC without raising the counting frequency. For example, 3 phase delays are added to the Least Significant Bit (LSB) of the high-speed clock. That is, the half cycle of bit[0] is cut into four equal parts, so as to add 2 bits to the resolution of ADC. However, the phase delay of the LSB is usually generated by a delay-locked loop (DLL) or a phase-locked loop (PLL), which would enlarge the layout area and the power consumption. Besides, different phase delays require a path balance in the layout to avoid increasing the differential nonlinearity (DNL) of the ADC, yet it will step up the difficulty of layout design.

Another conventional technology uses a local delay line to generate multiple phases in LSB, and a logic circuit determines which phase the transition time of an input signal locates in, so as to output the corresponding binary code according to the determination result. Nevertheless, it requires additional trim circuits to eliminate the PVT variation.

SUMMARY OF THE INVENTION

The invention provides a column analog-to-digital converter (CADC) with a local counting method which enables a local counting based on a comparator output signal, so as to raise the counting resolution and perform a self-compensation without trim circuits.

An embodiment of the invention provides a column analog-to-digital converter. The column analog-to-digital converter includes a plurality of analog-to-digital converters in parallel. Each of the analog-to-digital converters receives a ramp voltage, one of a plurality of column signals, and a base clock to generate a counting output. Each of the analog-to-digital converters includes a comparator and a counting circuit. The comparator is configured to compare the ramp voltage with one of the plurality of column signals to generate a comparator output signal. The counting circuit is configured to generate a local clock by means of a voltage-controlled oscillator of the counting circuit according to the base clock and the comparator output signal, count the base clock and the local clock respectively to generate a first counting output and a second counting output, and combine the first counting output with the second counting output to generate the counting output.

An embodiment of the invention provides a local counting method. A column analog-to-digital converter includes a plurality of analog-to-digital converters in parallel. The local counting method of the each analog-to-digital converter comprises as below. Each analog-to-digital converter compares a ramp voltage with one of column signals to generate a comparator output signal. A voltage-controlled oscillator of each analog-to-digital converter generates a local clock according to a base clock and the comparator output signal. Each analog-to-digital converter counts the base clock and the local clock respectively to generate a first counting output and a second counting output. Each analog-to-digital converter combines the first counting output with the second counting output to generate the counting output.

Based on the above, in the embodiments of the invention, in order to cope with the frequency limit caused by a timing violation and a long wire and to reduce a system complexity, the embodiments of the invention provide a column analog-to-digital converter (CADC) with a local counting method which enables a local counting based on a comparator output signal, so as to raise the counting resolution and perform a self-compensation without trim circuits.

To make the above features and advantages of the invention more comprehensible, embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
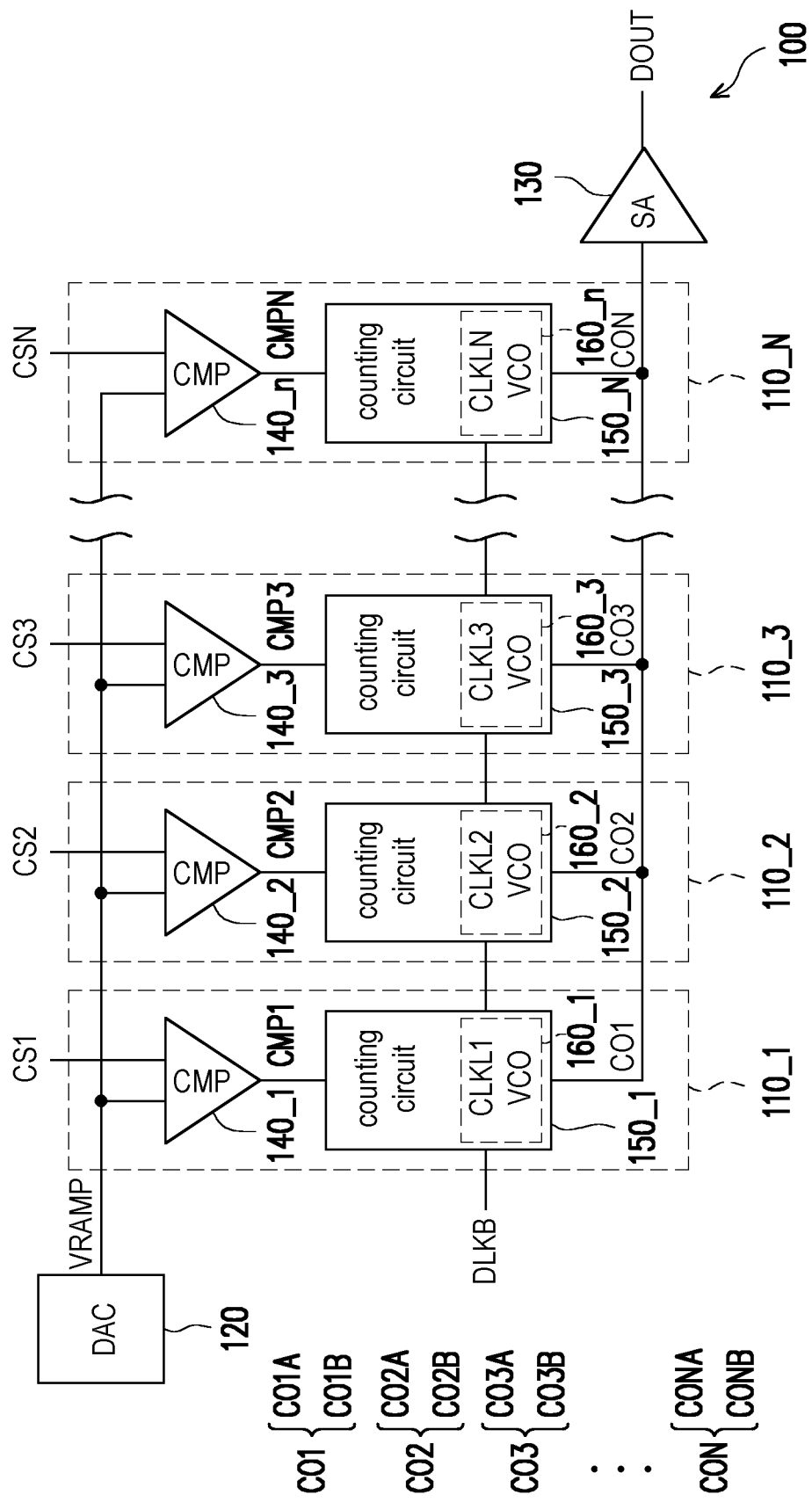
FIG. 1 is a schematic diagram illustrating a column analog-to-digital converter according to an embodiment of the invention.

Reference will now be made in detail to the embodiments of the invention, examples of which are illustrated in the accompanying drawings. Wherever possible, the same reference numbers are used in the drawings and the description to refer to the same or like parts.

Referring to FIG. 1, a column analog-to-digital converter 100 includes a plurality of analog-to-digital converters 110_1-110_N in parallel, a digital-to-analog converter 120 and a sense amplifier 130. The digital-to-analog converter 120 generates a ramp voltage VRAMP. The analog-to-digital converters 110_1-110_N receives the ramp voltage VRAMP, column signals CS1-CSN, and a base clock CLKB to generate the counting outputs CO1-CON. The column signals CS1-CSN are provided from corresponding columns of pixels of an image sensor, such as a CMOS Image sensor. The base clock CLKB may come from a conventional VCO, PLL or DLL. The sense amplifier 130 receives and read the counting outputs CO1-CON (data) to generate an output DOUT (logic), and the output DOUT may be provided to bit lines of memory. The implementations of the digital-to-analog converter 120 and the sense amplifier 130 are not limited in specific manner.

Giving the analog-to-digital converters 110_1 as an example, the analog-to-digital converters 110_1 includes a comparators 140_1 and a counting circuits 150_1, and the counting circuits 150_1 includes a built-in voltage-controlled oscillator 160_1. The comparators 140_1 compares the ramp voltage VRAMP with the column signals CS1 to generate the comparator output signals CMP1. Thereafter, the counting circuits 1501 generates the local clocks CLKL1 by means of the voltage-controlled oscillator 160_1 according to the base clock CLKB and the comparator output signals CMP1, counts the base clock CLKB to generate a first counting output CO1A, counts the local clocks CLKL1 to generate a second counting output CO1B, and combines the first counting output CO1A with the second counting output CO1B to generate the counting output CO1. The implementation of the comparator 140_1 is not limited.

In addition, since the analog-to-digital converters 110_2-110_N are column repeats and similar with analog-to-digital converters 110_1, details thereof with corresponding comparator output signals CMP2-CMPN, local clocks CLKL2-CLKLN, first counting outputs CO2A-CONA, and second counting outputs CO2B-CONB are not repeatedly again.

Figure 2:
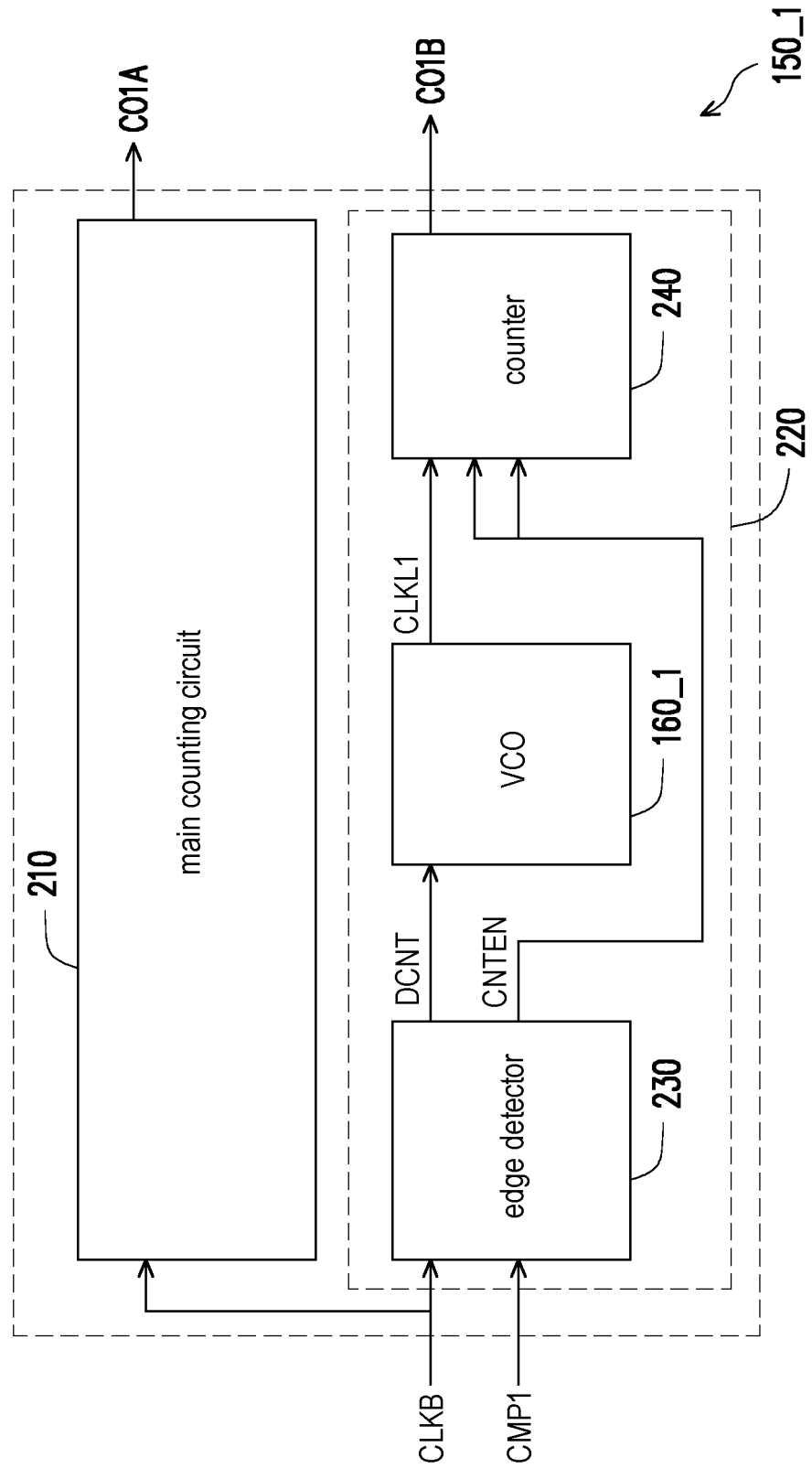
FIG. 2 is a circuit block diagram illustrating a counting circuit according to an embodiment of the invention.

FIG. 2 is a circuit block of the counting circuit 150_1 shown in FIG. 1 according to an embodiment of the invention. In the embodiment of FIG. 2, the counting circuit 150_1 includes a main counting circuit 210 and a local counting circuit 220. The main counting circuit 210 counts the base clock CLKB to generate the first counting output CO1A before the base clock CLKB and the comparator output signal CMP1 are both enabled. The local counting circuit 220 counts the local clock CLKL1 to generate the second counting output CO1B after the base clock CLKB and the comparator output signal CMP1 are both enabled. The relevant timing will be described afterwards. This architecture effectively increases the resolution of CADC since a local counting circuit 220 is added. For example, if the first counting output CO1A provided by the main counting circuit 210 is 10 bit and the second counting output CO1B provided by the local counting circuit 220 is 1 bit, the resolution of CADC would be raised to 11 bit. If the first counting output CO1A provided by the main counting circuit 210 is 10 bit and the second counting output CO1B provided by the local counting circuit 220 is 2 bit, the resolution of CADC would be raised to 12 bit.

The local counting circuit 220 includes an edge detector 230, the voltage-controlled oscillator 160_1, and a counter 240. The edge detector 230 detects the transition of the base clock CLKB and the comparator output signal COMP1 to generate a duty cycle enabling signal DCEN and a count enabling signal CNTEN. Specifically, the edge detector 230 may generate the duty cycle enabling signal DCEN and the count enabling signal CNTEN based on the rising edge or falling edge of the base clock CLKB and the comparator output signal COMP1 depending on the design requirement. The voltage-controlled oscillator 160_1 generates the local clock CLKL1 when the voltage-controlled oscillator 160_1 is enabled according to the duty cycle enabling signal DCEN and the counting enabling signal CNTEN. The counter 240 counts the local clock CLKL to generate the second counting output CO1B when the counter 240 is enabled according to the count enabling signal CNTEN.

Figure 3:
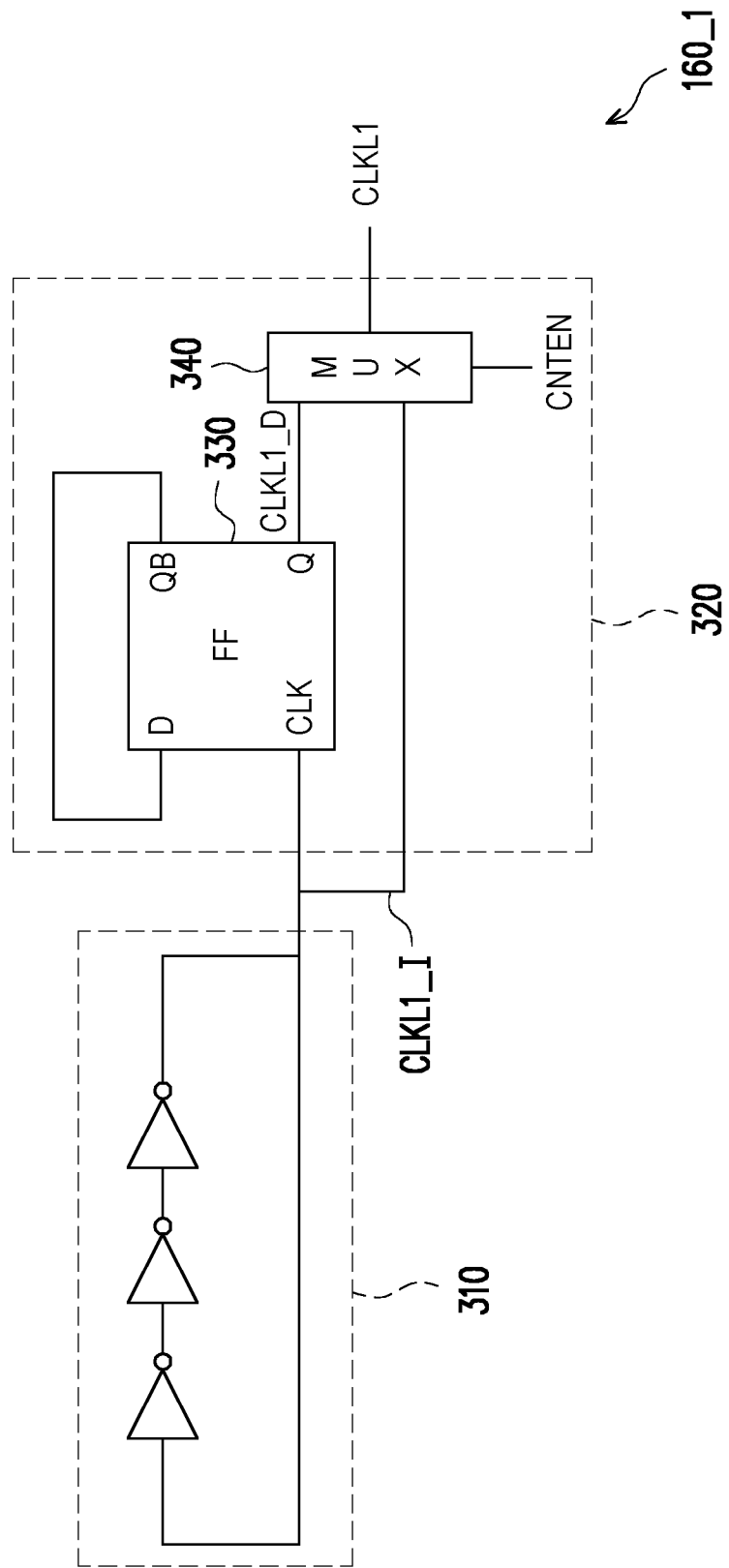
FIG. 3 is a circuit block diagram illustrating a voltage-controlled oscillator according to an embodiment of the invention.

FIG. 3 is a circuit block of the voltage-controlled oscillator 160_1 shown in FIG. 1 and FIG. 2 according to an embodiment of the invention. Referring to FIG. 3, the voltage-controlled oscillator 160_1 includes a ring oscillator 310 and a divider 320. The ring oscillator 310 includes a plurality of inverters, and generates an initial local clock CLKL1_I based on a number and delay time of the inverters. The divider 320 includes a flip-flop 330 and a multiplexer 340. The flip-flop 330 divides the initial local clock CLKL1_I to generate a divided local clock CLKL1_D, and the multiplexer 340 selects the initial local clock CLKL1_I or the divided local clock CLKL1_D as the local clock CLKL1 based on the count enabling signal CNTEN. In detail, the stage number of flip-flop 330 of the divider 320 is not limited, so that the frequency of the initial local clock CLKL1_I may be divided by $2^N$. It is noted that since the local counting circuit 220 belongs to a digital circuit, it is advantageous to be scaled in the logic process.

Figure 4A:
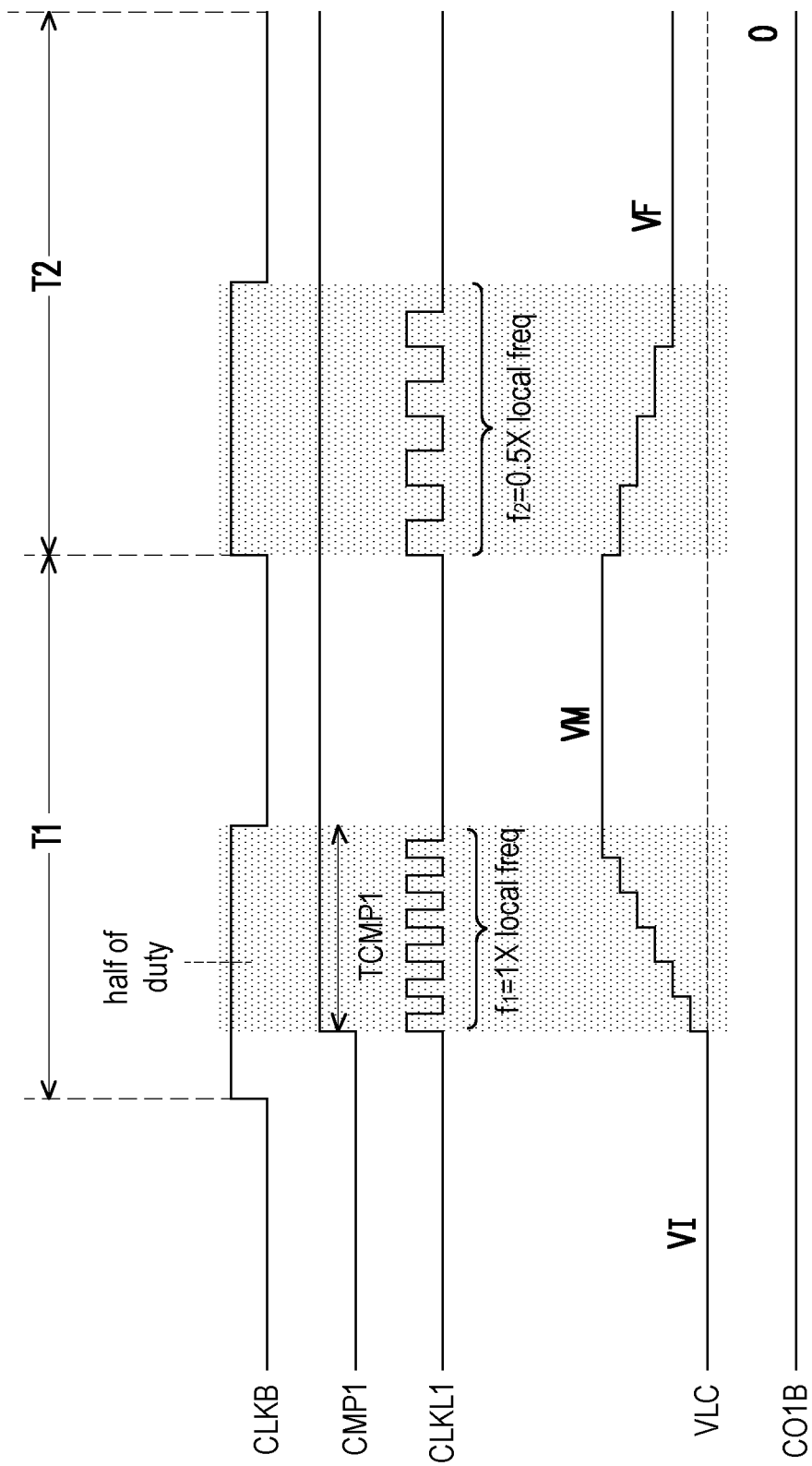
FIG. 4A is a timing diagram illustrating a local counting according to an embodiment of the invention.
Figure 4B:
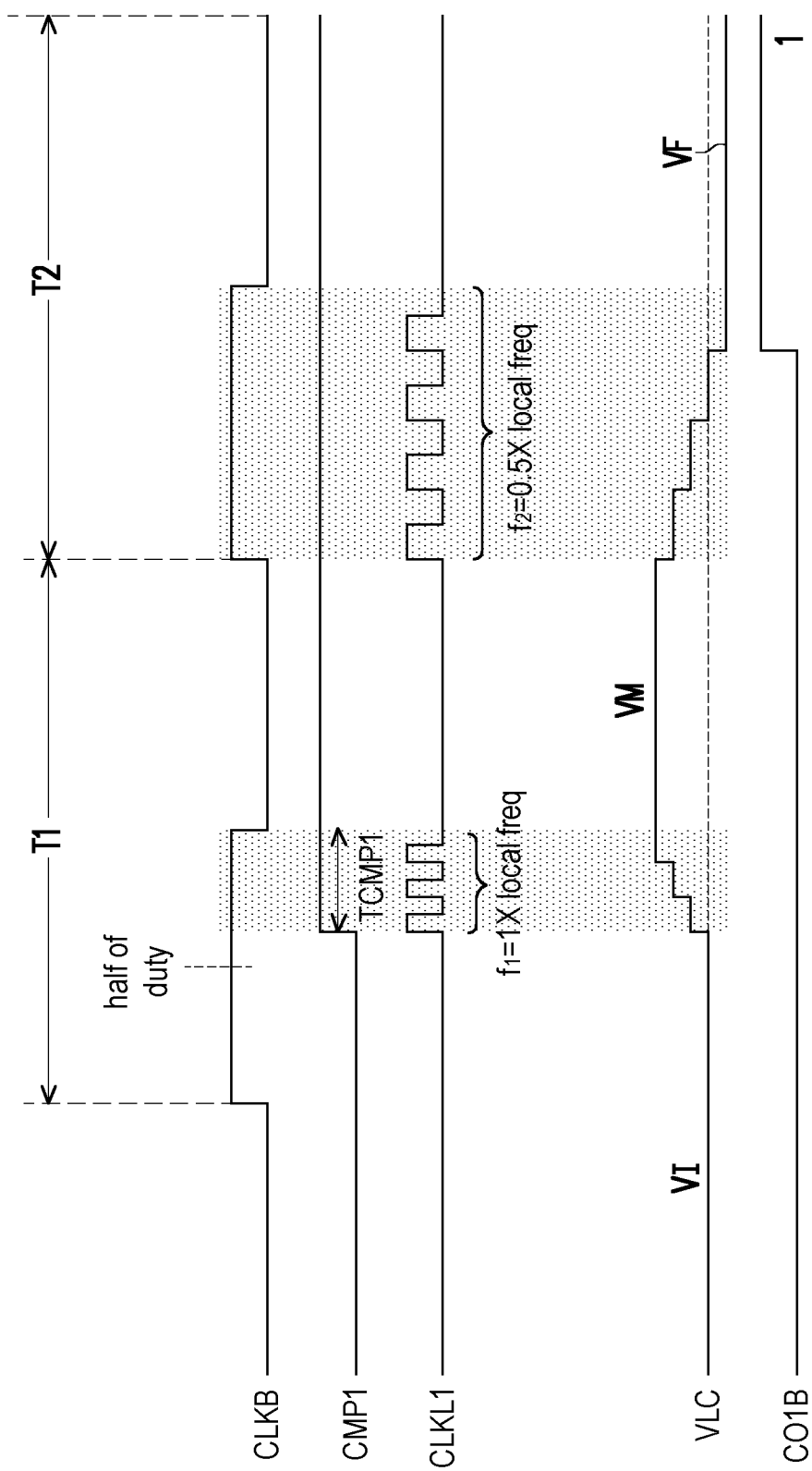
FIG. 4B is a timing diagram illustrating a local counting according to an embodiment of the invention.

FIG. 4A and FIG. 4B are timing diagrams illustrating a local counting according to an embodiment of the invention. Referring to FIG. 4A and FIG. 4B, the step of the counter 240 counting the local clock CLKL1 to generate the second counting output CO1B when the counter 240 is enabled according to the count enabling signal CNTEN may include as below.

During a first period T1 of the basic clock CLKB and when the basic clock CLKB and the comparator output signal CMP1 are both enabled, the voltage-controlled oscillator 160_1 provides the local clock CLKL1 having a first frequency f1 to the counter 240, as 1X local frequency within a duration TCMP1 shown in FIG. 4A and FIG. 4B. The counter 240 receives and counts the local clock CLKL1 having the first frequency f1 to generate a local counting value VLC, and the local counting value VLC is sequentially increased from an initial value VI corresponding to the counted local clock CLKL1 having the first frequency f1 until the basic clock CLKB is disabled, to generate an intermediate value VM of the local counting value VLC.

During a second period T2 of the basic clock CLKB and when the basic clock CLKB and the comparator output signal CMP1 are both enabled, the voltage-controlled oscillator 160_1 provides the local clock CLKL1 having a second frequency f2 to the counter 240, as 0.5× local frequency shown in FIG. 4A and FIG. 4B. The counter 240 receives and counts the local clock CLKL1 having the second frequency f2, and the local counting value VLC is sequentially decreased from the intermediate value VM corresponding to the counted local clock CLKL1 having the second frequency f2 until the basic clock CLKB is disabled, to generate a final value VF of the local counting value VLC. In this embodiment, the first frequency f1 is two times larger than the second frequency f2.

Next, the counter 240 compares the final value VF of the local counting value VLC with the initial value VI of the local counting value VLC to generate the second counting output CO1B. In the embodiment, when the final value VF is greater than the initial value VI as shown in FIG. 4A, the second counting output CO1B would be logic 0. And when the final value VF is less than the initial value VI as shown in FIG. 4B, the second counting output CO1B would be logic 1. In some embodiments, when the final value VF is greater than the initial value VI, the second counting output CO1B would be logic 1. And when the final value VF is less than the initial value VI, the second counting output CO1B would be logic 0. The invention does not limit the corresponding relationship between the logical value and the comparison result.

As such, the timing of enabling the comparator output signals CMP1 whether before the half of duty of the first period T1 or after the half of duty of the first period T1 would be certainly determined. For example, the timing of enabling the comparator output signals CMP1 is before the half of duty of the first period T1 as shown in FIG. 4A, and the timing of enabling the comparator output signals CMP1 is after the half of duty of the first period T1 as shown in FIG. 4B. In other words, one bit is added to the resolution of CADC in this embodiment.

Figure 5A:
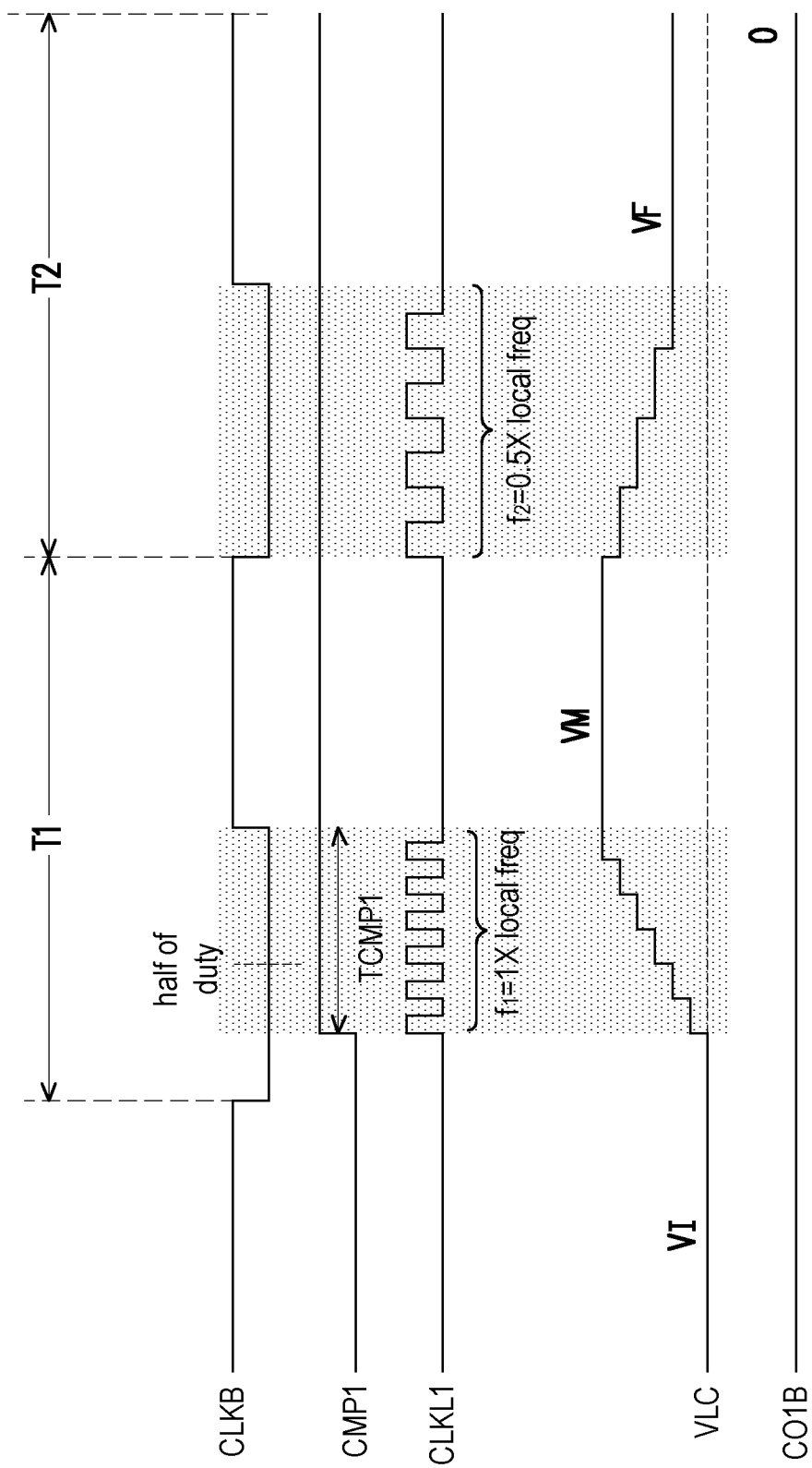
FIG. 5A is a timing diagram illustrating a local counting according to another embodiment of the invention.
Figure 5B:
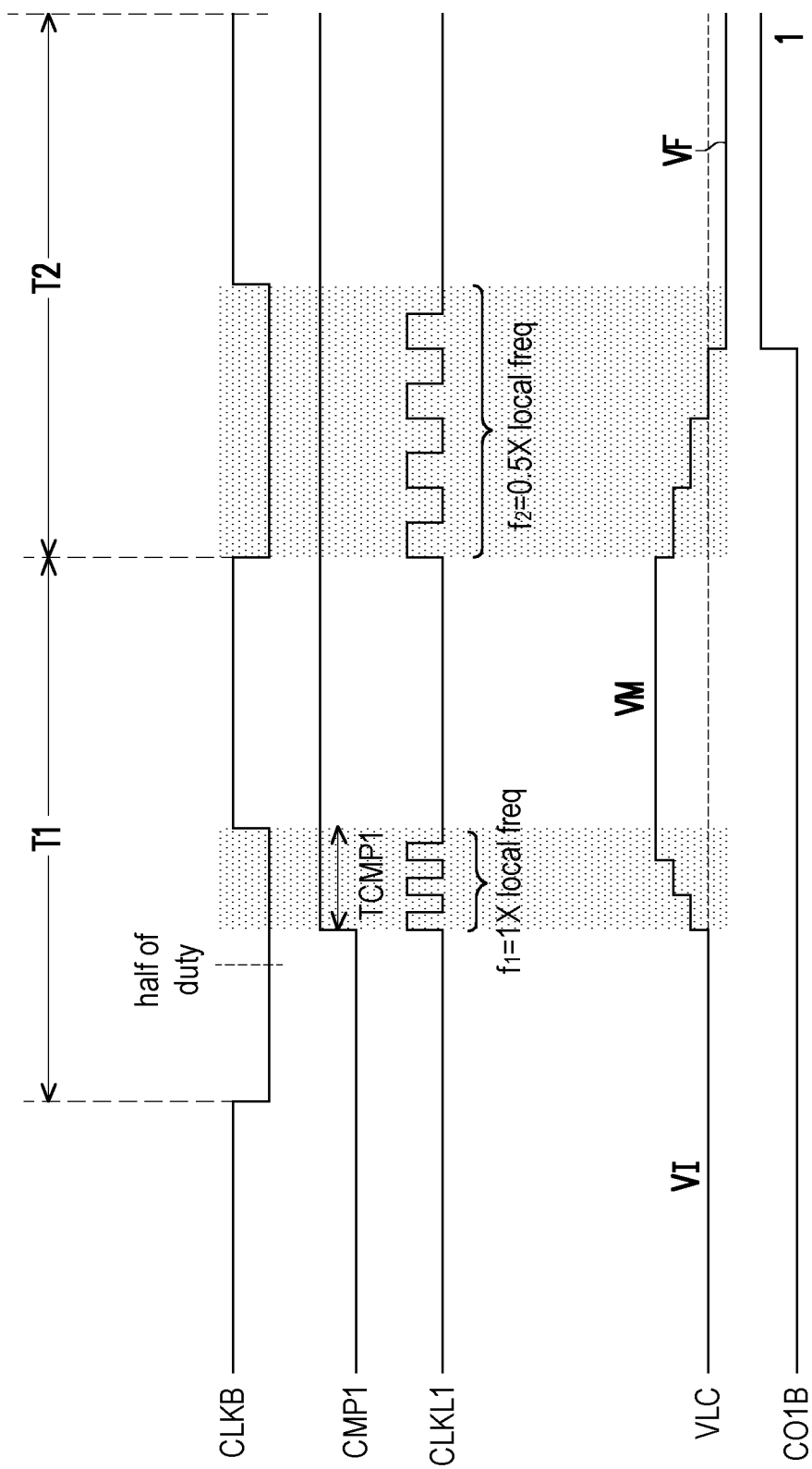
FIG. 5B is a timing diagram illustrating a local counting according to another embodiment of the invention.

It is noted that in this embodiment, the basic clock CLKB is enabled in positive duty as shown in FIG. 4A and FIG. 4B, yet in another embodiment, the basic clock CLKB may be enabled in negative duty as shown in FIG. 5A and FIG. 5B.

Figure 6:
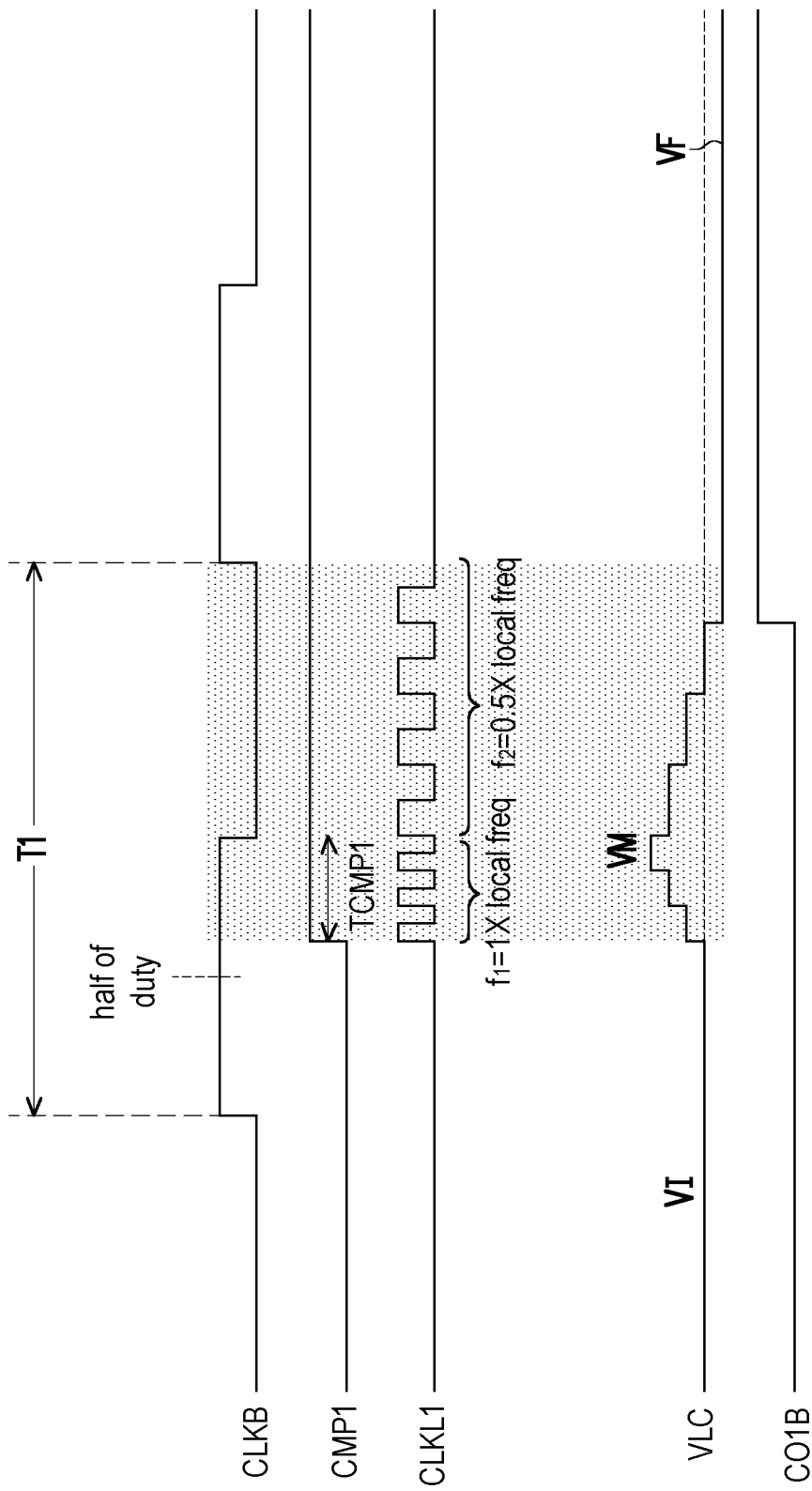
FIG. 6 is a timing diagram illustrating a local counting according to another embodiment of the invention.

FIG. 6 are timing diagrams illustrating a local counting with a positive counting and a negative counting within one period according to another embodiment of the invention. Referring to FIG. 6, the step of the counter 240 counting the local clock CLKL1 to generate the second counting output CO1B when the counter 240 is enabled according to the count enabling signal CNTEN may include as below.

During a first period T1 of the basic clock CLKB and when the basic clock CLKB and the comparator output signal CMP1 are both enabled, the voltage-controlled oscillator 160_1 provides the local clock CLKL1 having a first frequency f1 to the counter 240, as 1X local frequency within a duration TCMP1 shown in FIG. 6. The counter 240 receives and counts the local clock CLKL1 having the first frequency f1 to generate a local counting value VLC, and the local counting value VLC is sequentially increased from an initial value VI corresponding to the counted local clock CLKL1 having the first frequency f1 until the basic clock CLKB is disabled, to generate an intermediate value VM of the local counting value VLC.

When the basic clock CLKB is disabled, the voltage-controlled oscillator 160_1 immediately provides the local clock CLK1 having a second frequency f2 to the counter 240, as 0.5× local frequency shown in FIG. 6. The counter 240 receives and counts the local clock CLKL1 having the second frequency f2, and the local counting value VLC is sequentially decreased from the intermediate value VM corresponding to the counted local clock CLKL1 having the second frequency f2 until the first period T1 of the basic clock CLKB is ended, to generate a final value VF of the local counting value VLC. In this embodiment, the first frequency f1 is two times larger than the second frequency f2.

Next, the counter 240 compares the final value VF of the local counting value VLC with the initial value VI of the local counting value VLC to generate the second counting output CO1B. In the embodiment, when the final value VF is less than the initial value VI as shown in FIG. 6, the second counting output CO1B would be logic 1. And when the final value VF is greater than the initial value VI (not shown), the second counting output CO1B would be logic 0. It is worth mentioning that this embodiment of FIG. 6 is adapted to low frequency application compared to the embodiment of FIG. 4A and FIG. 4B.

Figure 7A:
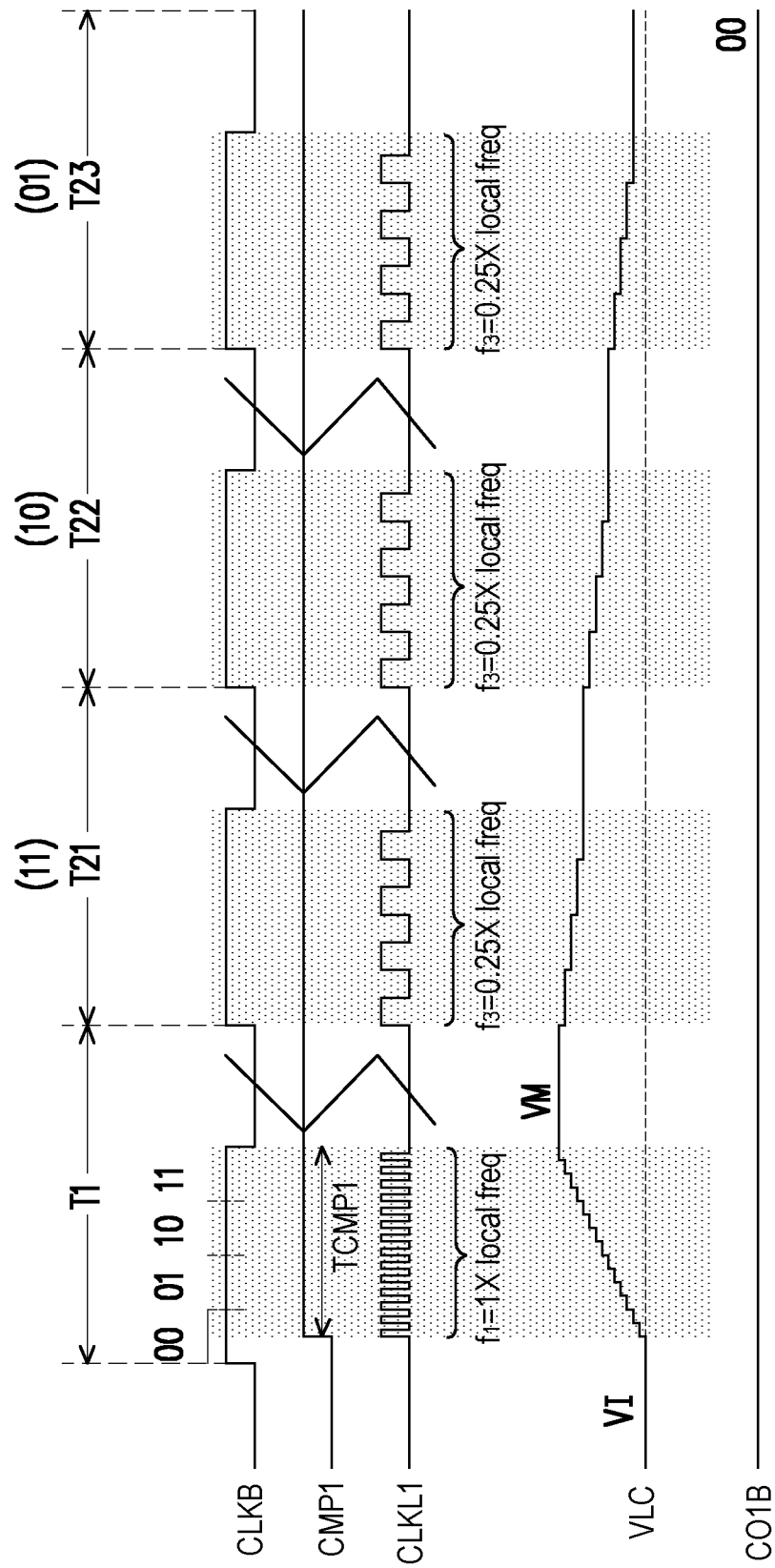
FIG. 7A-7D is a timing diagram illustrating a local counting according to another embodiment of the invention.

FIG. 7A-7D show a timing diagram illustrating a local counting with additional 2 bits of resolution according to another embodiment of the invention. Referring to FIG. 7A, the step of the counter 240 counting the local clock CLKL1 to generate the second counting output CO1B when the counter 240 is enabled according to the count enabling signal CNTEN may include as below.

During a first period T1 of the basic clock CLKB and when the basic clock CLKB and the comparator output signal CMP1 are both enabled, the voltage-controlled oscillator 160_1 provides the local clock CLKL1 having a first frequency f1 to the counter 240, as 1X local frequency within a duration TCMP1 shown in FIG. 7A. The counter 240 receives and counts the local clock CLKL1 having the first frequency f1 to generate a local counting value VLC, and the local counting value VLC is sequentially increased from an initial value VI corresponding to the counted local clock CLKL1 having the first frequency f1 until the basic clock CLKB is disabled, to generate an intermediate value VM of the local counting value VLC.

During the second periods T21, T22 and T23 after the first period T1 of the basic clock CLKB and when the basic clock CLKB and the comparator output signal CMP1 are both enabled, the voltage-controlled oscillator 160_1 provides the local clock CLKL1 having a third frequency f3 to the counter 240, as 0.25× local frequency shown in FIG. 7A. The counter 240 receives and counts the local clock CLKL1 having the third frequency f3, and the local counting value VLC is sequentially decreased from the intermediate value VM corresponding to the counted local clock CLKL1 having the third frequency f3 until the second period T23 is ended. In this embodiment, the first frequency f1 is four times larger than the third frequency f3.

Figure 7B:
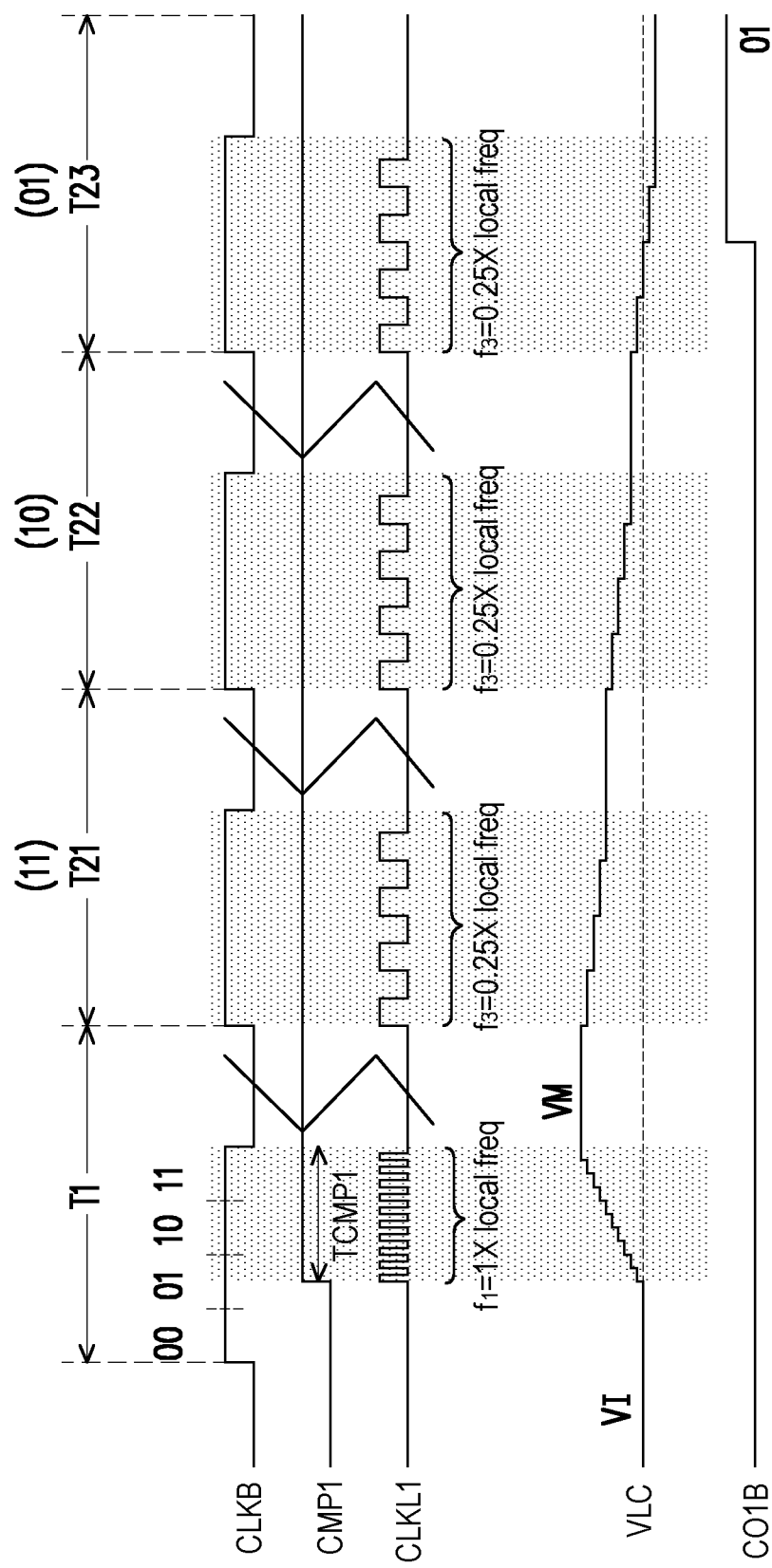
Figure 7C:
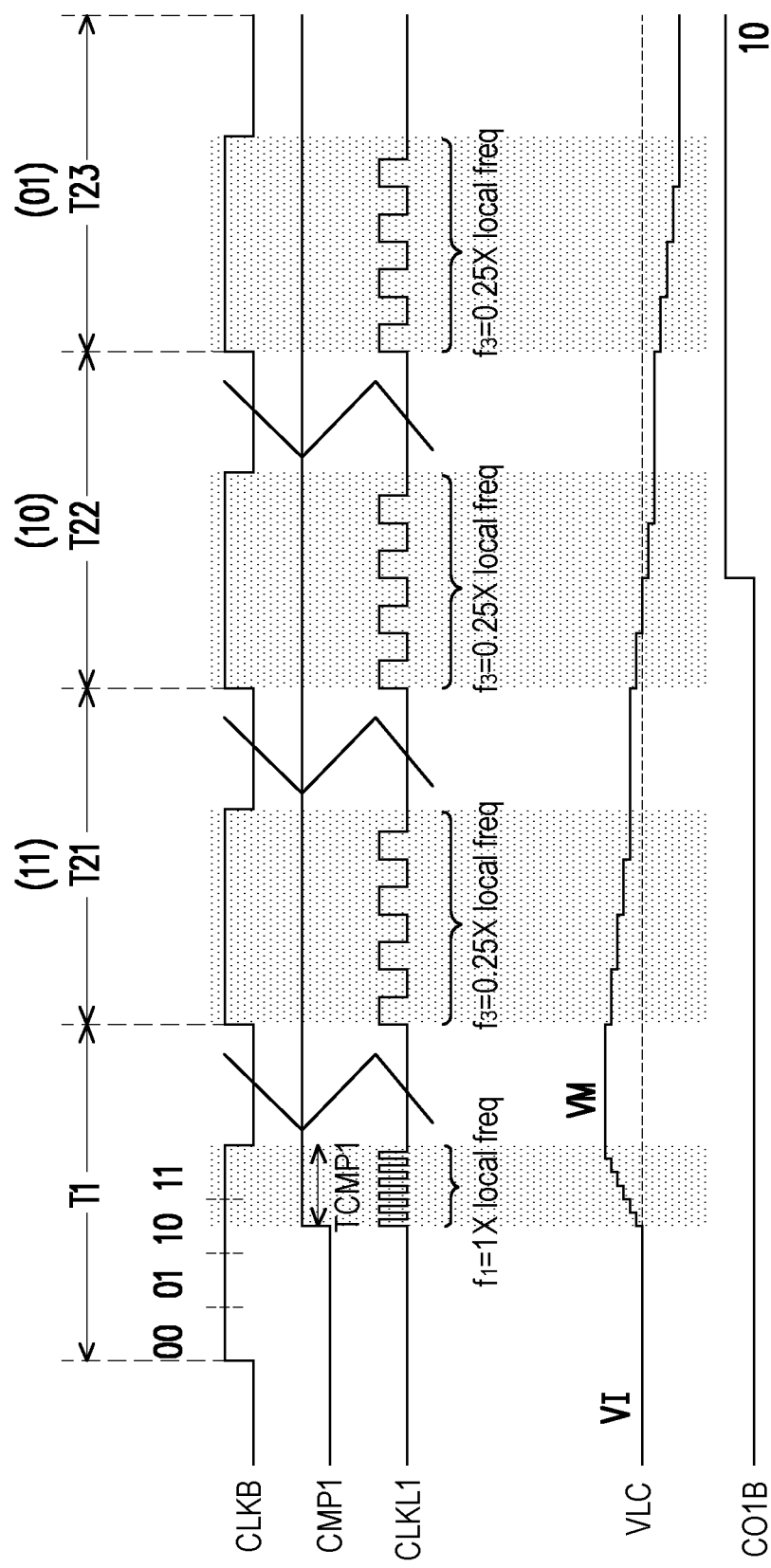
Figure 7D:
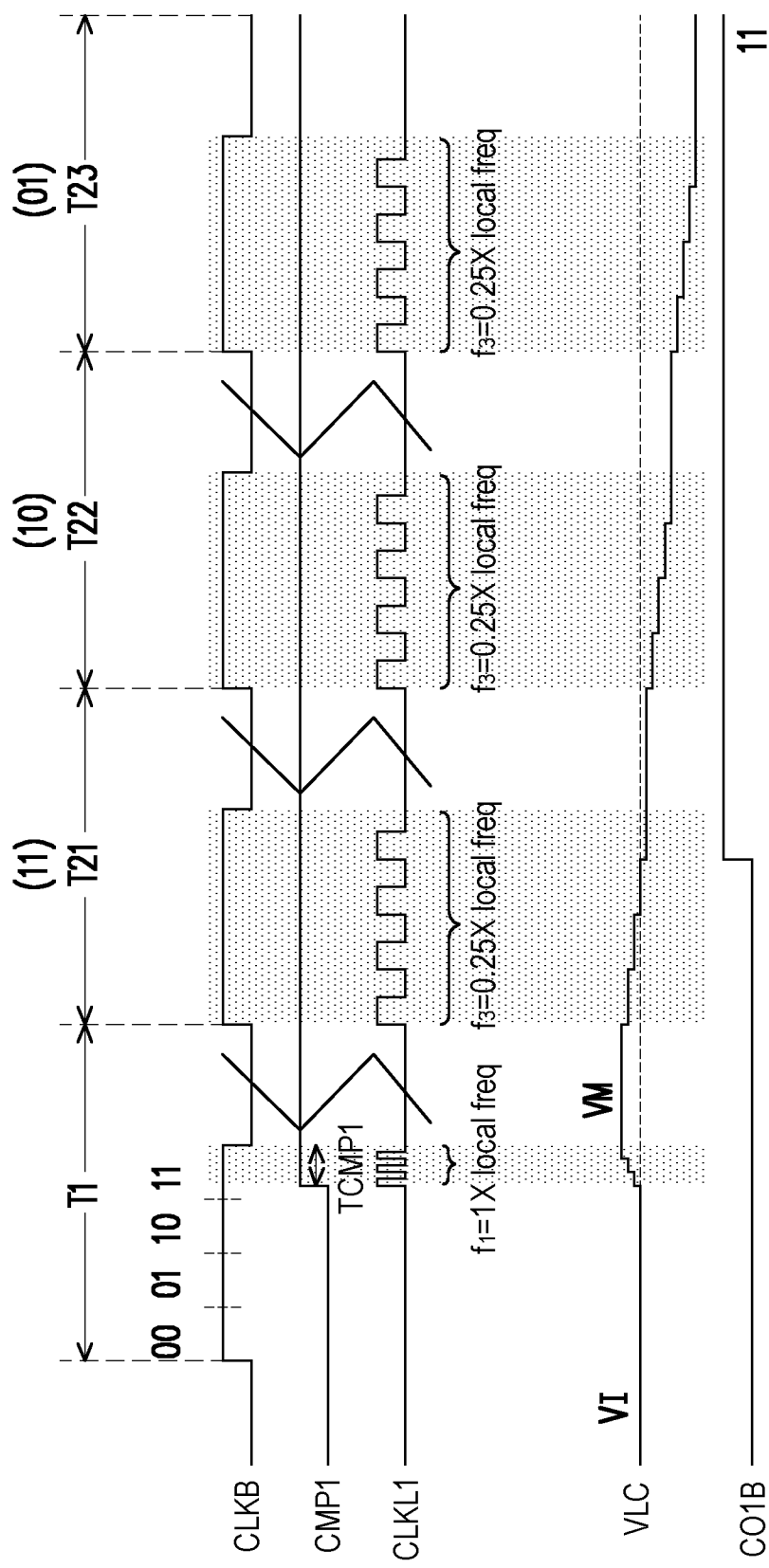

Next, the counter 240 takes a logic value when the local counting value VLC is just less than or equal to the initial value VI as the second counting output CO1B. For example, in this embodiment, when the local counting value VLC is just less than the initial value VI within the second period T23 which corresponds to logic 01 as shown in FIG. 7B, the second counting output CO1B would be logic 01. When the local counting value VLC is just less than the initial value VI within the second period T22 which corresponds to logic 10 as shown in FIG. 7C, the second counting output CO1B would be logic 10. And when the local counting value VLC is just less than the initial value VI within the second period T21 which corresponds to logic 11 as shown in FIG. 7D, the second counting output CO1B would be logic 11. It is mentioned that a period corresponding the logic 00 may be omitted since the logic value must be determined as logic 00 since the logic 01, 10 and 11 have not be taken, while the local counting value VLC is still greater than the initial value VI until the second period T23 is ended as shown in FIG. 7A. The invention does not limit the corresponding relationships between the logic values and the second periods T21, T22 and T23.

As such, the timing of enabling the comparator output signals CMP1 would be certainly determined. It is noted that the duty of the first period T1 is split to four parts, which corresponds to logics 00, 01, 10 and 11, respectively. In this embodiment, the timing of enabling the comparator output signals CMP1 in the first part of the duty of the first period T1 corresponds to logic 00 shown in FIG. 7A. The timing of enabling the comparator output signals CMP1 in the second part of the duty of the first period T1 corresponds to logic 01 shown in FIG. 7B. The timing of enabling the comparator output signals CMP1 in the third part of the duty of the first period T1 corresponds to logic 10 shown in FIG. 7C. The timing of enabling the comparator output signals CMP1 in the fourth part of the duty of the first period T1 corresponds to logic 11 shown in FIG. 7D. In other words, two bits are added to the resolution of CADC in this embodiment.

Figure 8:
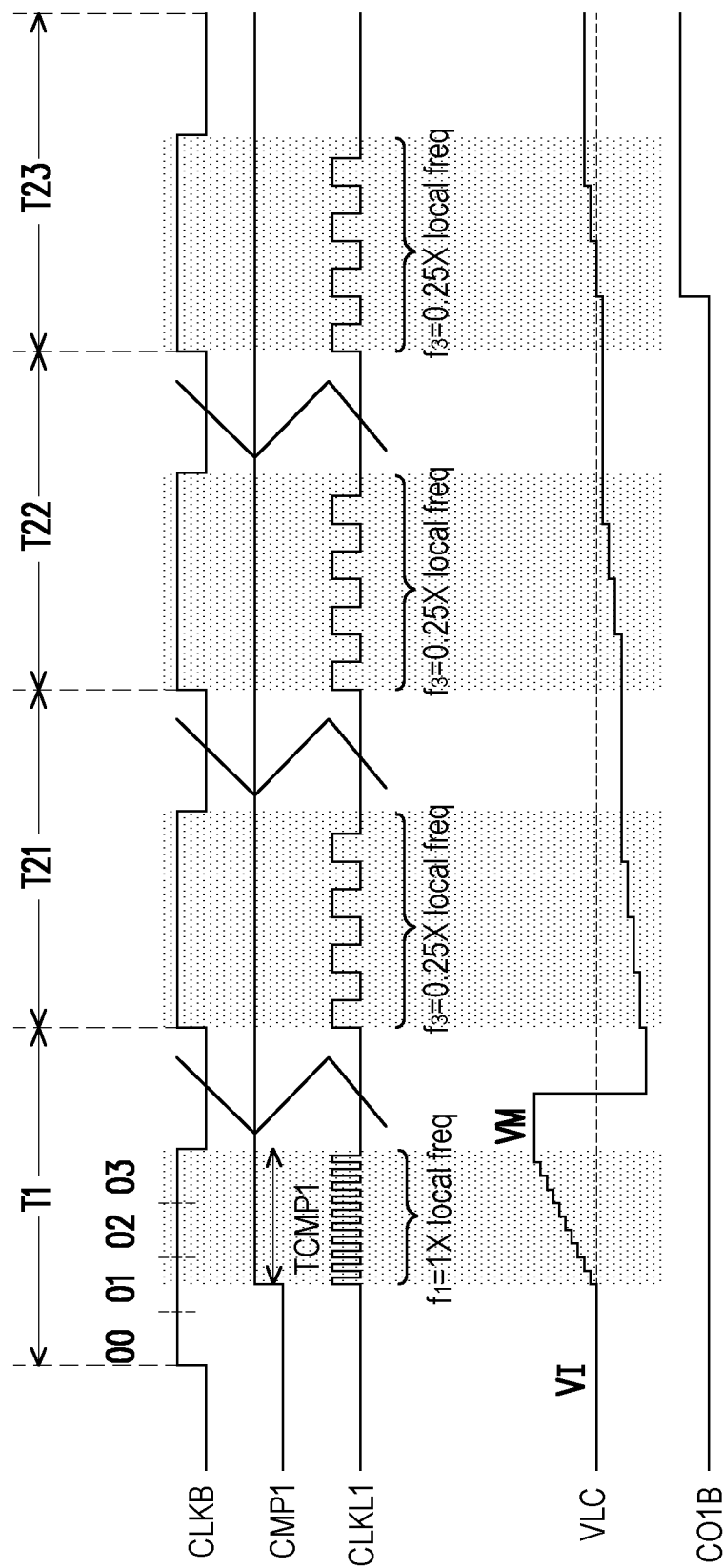
FIG. 8 is a timing diagram illustrating a local counting according to another embodiment of the invention.

FIG. 8 shows a timing diagram illustrating a local counting with additional 2 bits of resolution according to another embodiment of the invention. Referring to FIG. 8, the step of the counter 240 counting the local clock CLKL1 to generate the second counting output CO1B when the counter 240 is enabled according to the count enabling signal CNTEN may include as below.

During a first period T1 of the basic clock CLKB and when the basic clock CLKB and the comparator output signal CMP1 are both enabled, the voltage-controlled oscillator 160_1 provides the local clock CLKL1 having a first frequency f1 to the counter 240, as 1× local frequency within a duration TCMP1 shown in FIG. 8. The counter 240 receives and counts the local clock CLKL1 having the first frequency f1 to generate a local counting value VLC, and the local counting value VLC is sequentially increased from an initial value VI corresponding to the counted local clock CLKL1 having the first frequency f1 until the basic clock CLKB is disabled, to generate an intermediate value VM of the local counting value VLC.

Afterwards, the counter 240 complements the intermediate value VM of the local count value VLC to obtain a one's complement of the intermediate value VM of the local count value VLC before the second periods T21, T22 and T23 of the basic clock CLKB.

During the second periods T21, T22 and T23 after the first period T1 of the basic clock CLKB and when the basic clock CLKB and the comparator output signal CMP1 are both enabled, the voltage-controlled oscillator 160_1 provides the local clock CLKL1 having a third frequency f3 to the counter 240, as 0.25× local frequency shown in FIG. 8. The counter 240 receives and counts the local clock CLKL1 having the third frequency f3, and the local counting value VLC is sequentially increased from the one's complement of the intermediate value VM corresponding to the counted local clock CLKL1 having the third frequency f3 until the second period T23 is ended. In this embodiment, the first frequency f1 is four times larger than the third frequency 13.

Next, the counter 240 takes a logic value when the local counting value VLC is just greater than or equal to the initial value VI as the second counting output CO1B. Similar with FIG. 7A-7D, the relationships between the logic values and the second periods T21, T22 and T23 are not repeatedly again. Therefore, two bits are added to the resolution of CADC with an identical counting direction in this embodiment.

Figure 9:
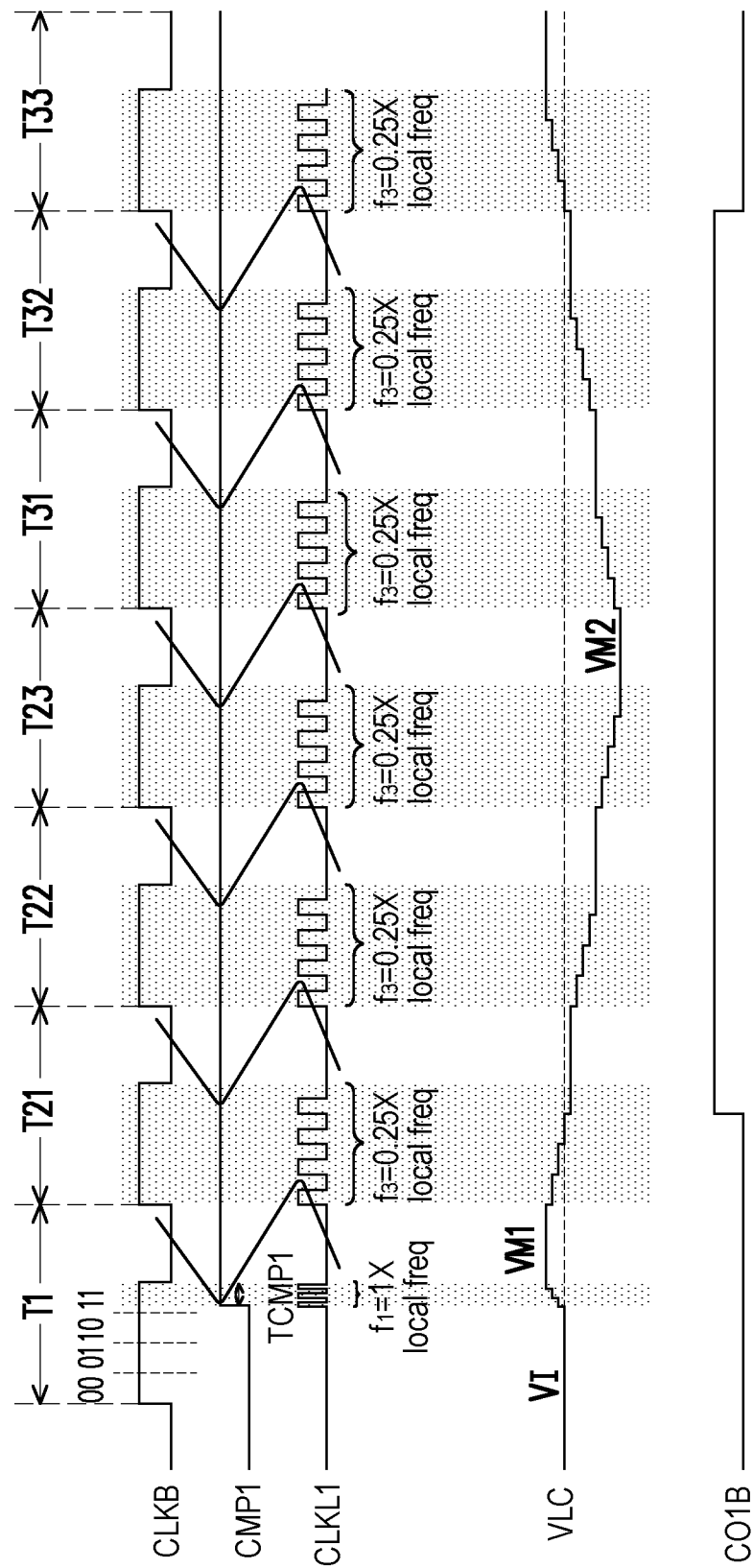
FIG. 9 is a timing diagram illustrating a local counting according to another embodiment of the invention.

FIG. 9 shows a timing diagram illustrating a local counting with additional 2 bits of resolution according to another embodiment of the invention. Referring to FIG. 9, the step of the counter 240 counting the local clock CLKL1 to generate the second counting output CO1B when the counter 240 is enabled according to the count enabling signal CNTEN may include as below.

During a first period T1 of the basic clock CLKB and when the basic clock CLKB and the comparator output signal CMP1 are both enabled, the voltage-controlled oscillator 160_1 provides the local clock CLKL1 having a first frequency f1 to the counter 240, as 1× local frequency within a duration TCMP1 shown in FIG. 9. The counter 240 receives and counts the local clock CLKL1 having the first frequency f1 to generate a local counting value VLC, and the local counting value VLC is sequentially increased from an initial value VI corresponding to the counted local clock CLKL1 having the first frequency f1 until the basic clock CLKB is disabled, to generate a first intermediate value VM1 of the local counting value VLC.

During the second periods T21, T22 and T23 after the first period T1 of the basic clock CLKB and when the basic clock CLKB and the comparator output signal CMP1 are both enabled, the voltage-controlled oscillator 160_1 provides the local clock CLKL1 having a third frequency f3 to the counter 240, as 0.25× local frequency shown in FIG. 9. The counter 240 receives and counts the local clock CLKL1 having the third frequency f3, and the local counting value VLC is sequentially decreased from the second intermediate value VM2 corresponding to the counted local clock CLKL1 having the third frequency f3 until the second period T23 is ended. In this embodiment, the first frequency f1 is four times larger than the third frequency 13.

During the third periods T31, T32 and T33 after the second periods T21, T22 and T23 of the basic clock CLKB and when the basic clock CLKB and the comparator output signal CMP1 are both enabled, the voltage-controlled oscillator 160_1 provides the local clock CLKL1 having a third frequency f to the counter 240, as 0.25× local frequency shown in FIG. 9. The counter 240 receives and counts the local clock CLKL1 having the third frequency f, and the local counting value VLC is sequentially increased from the second intermediate value VM2 corresponding to the counted local clock CLKL1 having the third frequency f until the third period T33 is ended.

Next, the counter 240 takes a logic value when the local counting value VLC is just greater than or equal to the initial value VI as the second counting output CO1B. Similar with FIG. 7A-7D, the relationships between the logic values and the second periods T31, T32 and T33 are not repeatedly again. Consequently, two bits are added to the resolution of CADC with the multi-sampling in this embodiment, so as to reduce the quantization error.

Figure 10:
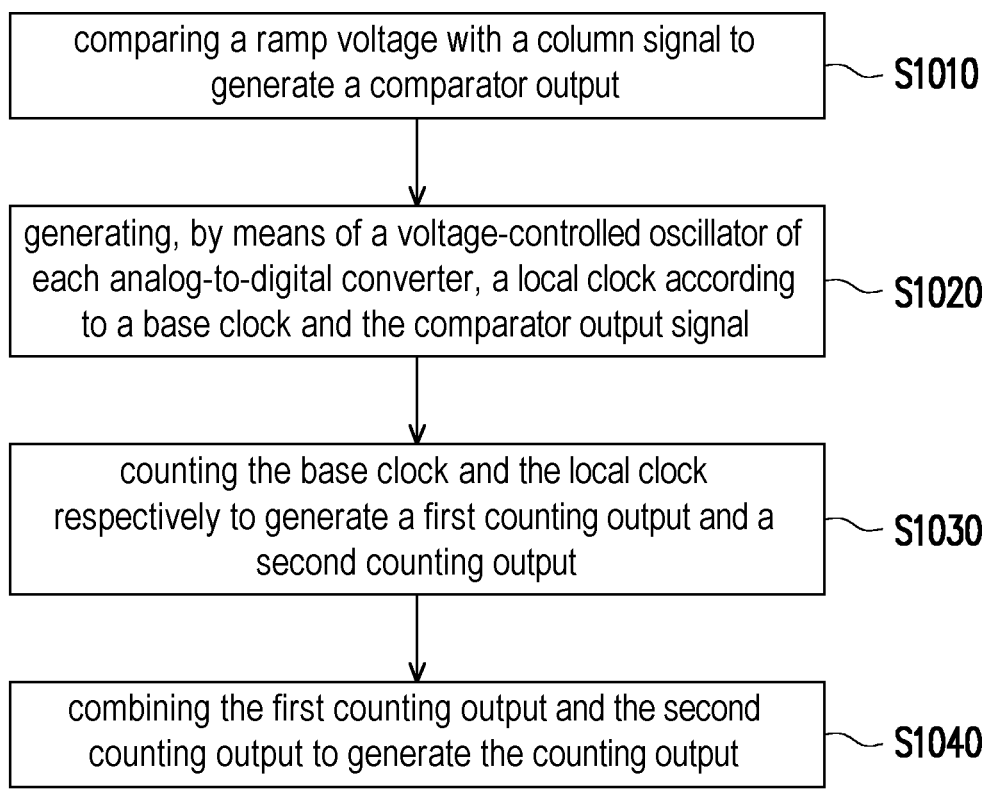
FIG. 10 is a flowchart illustrating a local counting method according to an embodiment of the invention.

FIG. 10 illustrates a flow chart of a local counting method according to one of the exemplary embodiments of the disclosure. A column analog-to-digital converter includes a plurality of analog-to-digital converters in parallel. The local counting method of each analog-to-digital converter comprises as below. In step 1010, each analog-to-digital converter compares a ramp voltage with one of column signals to generate a comparator output signal. Next, in step S1020, a voltage-controlled oscillator of the analog-to-digital converter generates a local clock according to a base clock and the comparator output signal. The analog-to-digital converter counts the base clock and the local clock respectively to generate a first counting output and a second counting output. The analog-to-digital converter combines the first counting output with the second counting output to generate the counting output.

Based on the above, in the embodiments of the invention, in order to cope with the frequency limit caused by timing violation and long wire and to reduce the system complexity, the embodiments of the invention provide a column analog-to-digital converter (CADC) with a local counting method which enables a local counting based on a comparator output signal without an trim circuits, so as to raise the counting resolution, perform the self-compensation and improve the PVT variation.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A column analog-to-digital converter, comprising a plurality of analog-to-digital converters in parallel, wherein each of the analog-to-digital converters comprises:
   a comparator, configured to compare a ramp voltage with one of a plurality of column signals to generate a comparator output signal; and
   a counting circuit, configured to generate a local clock by means of a voltage-controlled oscillator of the counting circuit according to a base clock and the comparator output signal, count the base clock and the local clock respectively to generate a first counting output and a second counting output, and combine the first counting output with the second counting output to generate a counting output.

2. The column analog-to-digital converter as claimed in claim 1, further comprising:
   a digital-to-analog converter, configured to generate the ramp voltage; and
   a sense amplifier, configured to receive the counting output generated by each of the analog-to-digital converters to generate an output.

3. The column analog-to-digital converter as claimed in claim 1, wherein the counting circuit comprises:
   a main counting circuit, configured to count the base clock to generate the first counting output before the base clock and the comparator output signal are both enabled;
   a local counting circuit, configured to count the local clock to generate the second counting output after the base clock and the comparator output signal are both enabled.

4. The column analog-to-digital converter as claimed in claim 3, wherein the local counting circuit comprises:
   an edge detector, configured to detect transition time of the base clock and the comparator output signal to generate a duty cycle enabling signal and a count enabling signal;
   the voltage-controlled oscillator, configured to generate the local clock when the voltage-controlled oscillator is enabled according to the duty cycle enabling signal; and
   a counter, configured to count the local clock to generate the second counting output when the counter is enabled according to the count enabling signal.

5. The column analog-to-digital converter as claimed in claim 4, wherein the voltage-controlled oscillator comprises:
   ring oscillator, comprising a plurality of inverters, configured to generate an initial local clock based on a number and delay time of the inverters; and
   divider, comprising a flip-flop and a multiplexer, wherein the flip-flop divides the initial local clock to generate a divided local clock, and the multiplexer selects the initial local clock or the divided local clock as the local clock based on the count enabling signal.

6. The column analog-to-digital converter as claimed in claim 4, wherein the step of the counter counting the local clock to generate the second counting output when the counter is enabled according to the count enabling signal comprises:
   during a first period of the basic clock and when the basic clock and the comparator output signal are both enabled, the voltage-controlled oscillator provides the local clock having a first frequency, the counter receives and counts the local clock having the first frequency, and the local counting value is sequentially increased from an initial value corresponding to the counted local clock having the first frequency until the basic clock is disabled, to generate an intermediate value of the local counting value;
   during a second period of the basic clock and when the basic clock and the comparator output signal are both enabled, the voltage-controlled oscillator provides the local clock having a second frequency, the counter receives and counts the local clock having the second frequency, and the local counting value is sequentially decreased from the intermediate value corresponding to the counted local clock having the second frequency until the basic clock is disabled to generate a final value of the local counting value, wherein the first frequency is larger than the second frequency; and
   the counter compares the final value of the local counting value with the initial value of the local counting value to generate the second counting output.

7. The column analog-to-digital converter as claimed in claim 4, wherein the step of the counter counting the local clock to generate the second counting output when the counter is enabled according to the count enabling signal comprises:
   during a first period of the basic clock and when the basic clock and the comparator output signal are both enabled, the voltage-controlled oscillator provides the local clock having a first frequency, the counter receives and counts the local clock having the first frequency, and the local counting value is sequentially increased from an initial value corresponding to the counted local clock having the first frequency until the basic clock is disabled, to generate an intermediate value of the local counting value;
   when the basic clock is disabled, the voltage-controlled oscillator immediately provides the local clock having a second frequency, the counter receives and counts the local clock having the second frequency, and the local counting value is sequentially decreased from the intermediate value corresponding to the counted local clock having the second frequency until the first period of the basic clock is ended, to generate a final value of the local counting value, wherein the first frequency is larger than the second frequency; and
   the counter compares the final value of the local counting value with the initial value of the local counting value to generate the second counting output.

8. The column analog-to-digital converter as claimed in claim 4, wherein the step of the counter counting the local clock to generate the second counting output when the counter is enabled according to the count enabling signal comprises:
during a first period of the basic clock and when the basic clock and the comparator output signal are both enabled, the voltage-controlled oscillator provides the local clock having a first frequency, the counter receives and counts the local clock having the first frequency, and the local counting value is sequentially increased from an initial value corresponding to the counted local clock having the first frequency until the basic clock is disabled, to generate an intermediate value of the local counting value;
during a plurality of second periods after the first period of the basic clock and when the basic clock and the comparator output signal are both enabled, the voltage-controlled oscillator provides the local clock having a third frequency, the counter receives and counts the local clock having the third frequency, and the local counting value is sequentially decreased from the intermediate value corresponding to the counted local clock having the third frequency until the plurality of second periods of the basic clock are ended, wherein the first frequency is larger than the third frequency; and
the counter takes a logic value corresponding to one of the plurality of second periods of the basic clock when the local counting value is just less than or equal to the initial value as the second counting output.

9. The column analog-to-digital converter as claimed in claim 4, wherein the step of the counter counting the local clock to generate the second counting output when the counter is enabled according to the count enabling signal comprises:
during a first period of the basic clock and when the basic clock and the comparator output signal are both enabled, the voltage-controlled oscillator provides the local clock having a first frequency, the counter receives and counts the local clock having the first frequency, and the local counting value is sequentially increased from an initial value corresponding to the counted local clock having the first frequency until the basic clock is disabled, to generate an intermediate value of the local counting value;
complementing the intermediate value of the local count value to obtain a one's complement of the intermediate value of the local count value before a plurality of second periods of the basic clock;
during the plurality of second periods after the first period of the basic clock and when the basic clock and the comparator output signal are both enabled, the voltage-controlled oscillator provides the local clock having a third frequency, the counter receives and counts the local clock having the third frequency, and the local counting value is sequentially increased from the one's complement of the intermediate value corresponding to the counted local clock having the third frequency until the plurality of second periods of the basic clock are ended, wherein the first frequency is larger than the third frequency; and
the counter takes a logic value corresponding to one of the plurality of second periods of the basic clock when the local counting value is just greater than or equal to the initial value as the second counting output.

10. The column analog-to-digital converter as claimed in claim 4, wherein the step of the counter counting the local clock to generate the second counting output when the counter is enabled according to the count enabling signal comprises:
during a first period of the basic clock and when the basic clock and the comparator output signal are both enabled, the voltage-controlled oscillator provides the local clock having a first frequency, the counter receives and counts the local clock having the first frequency, and the local counting value is sequentially increased from an initial value corresponding to the counted local clock having the first frequency until the basic clock is disabled, to generate a first intermediate value of the local counting value;
during a plurality of second periods after the first period of the basic clock and when the basic clock and the comparator output signal are both enabled, the voltage-controlled oscillator provides the local clock having a third frequency, the counter receives and counts the local clock having the third frequency, and the local counting value is sequentially decreased from the first intermediate value corresponding to the counted local clock having the third frequency until the plurality of second periods of the basic clock are ended to generate a second immediate value of the local counting value;
during a plurality of third periods after the plurality of second periods of the basic clock and when the basic clock and the comparator output signal are both enabled, the voltage-controlled oscillator provides the local clock having the third frequency, the counter receives and counts the local clock having the third frequency, and the local counting value is sequentially increased from the second intermediate value corresponding to the counted local clock having the third frequency until the plurality of third periods of the basic clock are ended, wherein the first frequency is larger than the third frequency; and
the counter takes a logic value corresponding to one of the plurality of third periods of the basic clock when the local counting value is just greater than or equal to the initial value as the second counting output.

11. A local counting method, adapted to a column analog-to-digital converter comprising a plurality of analog-to-digital converters in parallel, wherein the local counting method comprises:
comparing a ramp voltage with one of a plurality of column signals to generate a comparator output signal;
generating, by means of a voltage-controlled oscillator of each analog-to-digital converter, a local clock according to a base clock and the comparator output signal;
counting the base clock and the local clock respectively to generate a first counting output and a second counting output; and
combining the first counting output with the second counting output to generate the counting output.

12. The local counting method as claimed in claim 11, further comprising:
generating the ramp voltage; and
receiving and reading the counting output generated by each of the analog-to-digital converters to generate an output.

13. The local counting method as claimed in claim 11, further comprising:
counting the base clock to generate the first counting output before the base clock and the comparator output signal are both enabled; and counting the local clock to generate the second counting output after the base clock and the comparator output signal are both enabled.

14. The local counting method as claimed in claim 13, wherein the step of counting the local clock to generate the second counting output after the base clock and the comparator output signal are both enabled comprises:
  detecting transition time of the base clock and the comparator output signal to generate a duty cycle enabling signal and a count enabling signal;
  generating the local clock according to the duty cycle enabling signal and the count enabling signal; and
  counting the local clock to generate the second counting output when the counter is enabled according to the count enabling signal.

15. The local counting method as claimed in claim 14, wherein the step of generating the local clock according to the duty cycle enabling signal and the count enabling signal comprises:
  generating an initial local clock based on a number and delay time of the inverters; and
  dividing the initial local clock to generate a divided local clock, and selecting the initial local clock or the divided local clock as the local clock based on the count enabling signal.

16. The local counting method as claimed in claim 11, wherein the step of counting the local clock to generate the second counting output according to the count enabling signal comprises:
  during a first period of the basic clock and when the basic clock and the comparator output signal are both enabled, providing the local clock having a first frequency, receiving and counting the local clock having the first frequency, and the local counting value being sequentially increased from an initial value corresponding to the counted local clock having the first frequency until the basic clock is disabled, to generate an intermediate value of the local counting value;
  during a second period of the basic clock and when the basic clock and the comparator output signal are both enabled, providing the local clock having a second frequency, receiving and counting the local clock having the second frequency, and local counting value being sequentially decreased from the intermediate value corresponding to the counted local clock having the second frequency until the basic clock is disabled to generate an final value of the local counting value, wherein the first frequency is larger than the second frequency; and
  comparing the final value of the local counting value with the initial value of the local counting value to generate the second counting output.

17. The local counting method as claimed in claim 14, wherein the step of counting the local clock to generate the second counting output according to the count enabling signal comprises:
  during a first period of the basic clock and when the basic clock and the comparator output signal are both enabled, providing the local clock having a first frequency, receiving and counting the local clock having the first frequency, and the local counting value being sequentially increased from an initial value corresponding to the counted local clock having the first frequency until the basic clock is disabled, to generate an intermediate value of the local counting value;
  when the basic clock is disabled, immediately providing the local clock having a second frequency, receiving and counting the local clock having the second frequency, and the local counting value being sequentially decreased from the intermediate value corresponding to the counted local clock having the second frequency until the first period of the basic clock is ended, to generate a final value of the local counting value, wherein the first frequency is larger than the second frequency; and
  comparing the final value of the local counting value with the initial value of the local counting value to generate the second counting output.

18. The local counting method as claimed in claim 14, wherein the step of counting the local clock to generate the second counting output according to the count enabling signal comprises:
  during a first period of the basic clock and when the basic clock and the comparator output signal are both enabled, providing the local clock having a first frequency, receiving and counting the local clock having the first frequency, and the local counting value being sequentially increased from an initial value corresponding to the counted local clock having the first frequency until the basic clock is disabled, to generate an intermediate value of the local counting value;
  during a plurality of second periods after the first period of the basic clock and when the basic clock and the comparator output signal are both enabled, providing the local clock having a third frequency, receiving and counting the local clock having the third frequency, and the local counting value being sequentially decreased from the intermediate value corresponding to the counted local clock having the third frequency until the plurality of second periods of the basic clock are ended, wherein the first frequency is larger than the third frequency; and
  taking a logic value corresponding to one of the plurality of second periods of the basic clock when the local counting value is just less than or equal to the initial value as the second counting output.

19. The local counting method as claimed in claim 14, wherein the step of counting the local clock to generate the second counting output according to the count enabling signal comprises:
  during a first period of the basic clock and when the basic clock and the comparator output signal are both enabled, providing the local clock having a first frequency, receiving and counting the local clock having the first frequency, and the local counting value being sequentially increased from an initial value corresponding to the counted local clock having the first frequency until the basic clock is disabled, to generate an intermediate value of the local counting value;
  complementing the intermediate value of the local count value to obtain a one's complement of the intermediate value of the local count value before a plurality of second periods of the basic clock;
  during the plurality of second periods after the first period of the basic clock and when the basic clock and the comparator output signal are both enabled, providing the local clock having a third frequency, receiving and counting the local clock having the third frequency, and the local counting value being sequentially increased from the one's complement of the intermediate value corresponding to the counted local clock having the third frequency until the plurality of second periods of the basic clock are ended, wherein the first frequency is larger than the third frequency; and taking a logic value corresponding to one of the plurality of second periods of the basic clock when the local counting value is just greater than or equal to the initial value as the second counting output.

20. The local counting method as claimed in claim 14, wherein the step of counting the local clock to generate the second counting output according to the count enabling signal comprises:

during a first period of the basic clock and when the basic clock and the comparator output signal are both enabled, providing the local clock having a first frequency, receiving and counting the local clock having the first frequency, and the local counting value being sequentially increased from an initial value corresponding to the counted local clock having the first frequency until the basic clock is disabled, to generate a first intermediate value of the local counting value;

during a plurality of second periods after the first period of the basic clock and when the basic clock and the comparator output signal are both enabled, providing the local clock having a third frequency, receiving and counting the local clock having the third frequency, and the local counting value being sequentially decreased from the first intermediate value corresponding to the counted local clock having the third frequency until the plurality of second periods of the basic clock are ended, to generate a second immediate value of the local counting value;

during a plurality of third periods after the plurality of second periods of the basic clock and when the basic clock and the comparator output signal are both enabled, providing the local clock having the third frequency, receiving and counting the local clock having the third frequency, and the local counting value being sequentially increased from the second intermediate value corresponding to the counted local clock having the third frequency until the plurality of third periods of the basic clock are ended, wherein the first frequency is larger than the third frequency; and taking a logic value corresponding to one of the plurality of third periods of the basic clock when the local counting value is just greater than or equal to the initial value as the second counting output.

\* \* \* \* \*